(12) United States Patent
Alonso et al.

(10) Patent No.: US 10,057,999 B2
(45) Date of Patent: Aug. 21, 2018

(54) ELECTRONIC DEVICE HAVING A REDUCED DEAD BORDER

(71) Applicant: Microsoft Technology Licensing, LLC, Redmond, WA (US)

(72) Inventors: Vicente Calvo Alonso, Piispanristi (FI); Oiva Sahlsten, Salo (FI); Petri Merivirta, Salo (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/163,653

(22) Filed: May 24, 2016

(65) Prior Publication Data

US 2017/0347474 A1    Nov. 30, 2017

(51) Int. Cl.
| | |
|---|---|
| *H05K 7/02* | (2006.01) |
| *H05K 7/04* | (2006.01) |
| *H05K 5/02* | (2006.01) |
| *B32B 3/08* | (2006.01) |
| *B32B 7/12* | (2006.01) |
| *H05K 5/00* | (2006.01) |
| *H05K 5/03* | (2006.01) |

(52) U.S. Cl.
CPC ............ *H05K 5/0217* (2013.01); *B32B 3/08* (2013.01); *B32B 7/12* (2013.01); *H05K 5/0017* (2013.01); *H05K 5/03* (2013.01); *B32B 2255/26* (2013.01); *B32B 2307/41* (2013.01); *B32B 2307/412* (2013.01); *B32B 2457/20* (2013.01)

(58) Field of Classification Search
CPC ...... H05K 5/0217; H05K 5/0017; H05K 5/03; B32B 3/08; B32B 7/12; B32B 2457/20; B32B 2307/41; B32B 2307/412; B32B 2255/26

USPC ................ 361/728–730, 752, 807, 809, 810
See application file for complete search history.

(56) References Cited

U.S. PATENT DOCUMENTS

| | | |
|---|---|---|
| 6,414,781 B1 | 7/2002 | Saitoh |
| 6,528,944 B1 | 3/2003 | Kishi et al. |

(Continued)

FOREIGN PATENT DOCUMENTS

WO    2012066388 A1    5/2012

OTHER PUBLICATIONS

"International Search Report and Written Opinion Issued in PCT Application No. PCT/US2017/033197", dated Jul. 27, 2017, 15 Pages.

(Continued)

*Primary Examiner* — Hung S Bui

(57) ABSTRACT

An electronic device having two or more opposing sides is disclosed. The electronic device comprises a display module, a window on the display module, and a frame at least partly surrounding the display module. The frame comprises, at two or more opposing sides of the electronic device, a side portion and an upper portion extending a determined distance from the side portion towards the opposing side of the electronic device and ending at an inner edge defining an opening having a width smaller than the width of the display module. The display module has an active area and an inactive area. The display module is disposed within the frame so that at least a part of the inactive area is disposed below and covered by the upper portion, at least a part of the active area being visible through the opening. The window is disposed in the opening.

20 Claims, 5 Drawing Sheets

(56) References Cited

U.S. PATENT DOCUMENTS

| | | | |
|---|---|---|---|
| 6,611,302 B1 * | 8/2003 | Ueda | G02F 1/133308 |
| | | | 349/58 |
| 6,654,083 B1 | 11/2003 | Toda et al. | |
| 8,670,085 B2 | 3/2014 | Jean et al. | |
| 8,717,327 B2 | 5/2014 | Hering | |
| 9,354,476 B2 * | 5/2016 | Han | G02F 1/13452 |
| 9,398,711 B2 * | 7/2016 | In | H05K 7/00 |
| 2012/0218219 A1 | 8/2012 | Rappoport et al. | |
| 2013/0002976 A1 | 1/2013 | Notermans | |
| 2013/0094160 A1 | 4/2013 | Narumi | |
| 2013/0300975 A1 | 11/2013 | Suzuki | |
| 2014/0198267 A1 | 7/2014 | Jeong et al. | |
| 2014/0203703 A1 | 7/2014 | Maatta | |
| 2014/0211507 A1 | 7/2014 | Notermans | |
| 2014/0285747 A1 | 9/2014 | Jun et al. | |
| 2015/0063595 A1 | 3/2015 | Kemppinen et al. | |
| 2015/0205022 A1 * | 7/2015 | Kim | B32B 37/12 |
| | | | 428/192 |
| 2015/0220116 A1 | 8/2015 | Kemppinen et al. | |
| 2015/0362652 A1 * | 12/2015 | Hayashi | G02B 6/005 |
| | | | 362/607 |

OTHER PUBLICATIONS

"Japan Display Inc. Announces Mass Production of High-Resolution", Published on: Oct. 16, 2013, 2 pages, Available at: http://www.cn-lanyuan.com/en/newsView.asp?id=1059.

Pratap, Ketan, "LG Unveils 5.3-Inch Smartphone Display With World's Narrowest Bezel", Published on: Oct. 30, 2014, 3 pages, vailable at: http://gadgets.ndtv.com/mobiles/news/lg-unveils-53-inch-smartphone-display-with-worlds-narrowest-bezel-614040.

* cited by examiner

ELECTRONIC DEVICE HAVING A REDUCED DEAD BORDER

BACKGROUND

Display modules are used in various electronic devices, such as portable or mobile devices. Such devices may have a significant dead border, i.e. the area from outer edges of the device to the active area of the display module. The dead border may be formed by the inactive area of the display module, often referred to as black matrix, the mechanics around the display module, and any screen printing of the window covering the display module.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

An electronic device having two or more opposing sides is disclosed. The electronic device may comprise a display module having a width and a length, a window on the display module, and a frame at least partly surrounding the display module. The frame may comprise, at two or more opposing sides of the electronic device, a side portion and an upper portion on an upper side of the electronic device, the upper portion extending a determined distance from the side portion towards the opposing side of the electronic device and ending at an inner edge of the upper portion, and the inner edge of the upper portion defining an opening having a width smaller than the width of the display module. The display module may have an active area and an inactive area adjacent to the active area and at the periphery of the display module. The display module may be disposed within the frame so that at least a part of the inactive area is disposed below and covered by the upper portion of the frame, at least a part of the active area being visible through the opening, and the window may be disposed in the opening.

Many of the attendant features will be more readily appreciated as the same becomes better understood by reference to the following detailed description considered in connection with the accompanying drawings.

DESCRIPTION OF THE DRAWINGS

The present description will be better understood from the following detailed description read in light of the accompanying drawings, wherein.

The drawings in the FIGS. 1 to 7C are not necessarily to scale.

DETAILED DESCRIPTION

The detailed description provided below in connection with the appended drawings is intended as a description of a number of embodiments and is not intended to represent the only forms in which the embodiments may be constructed, implemented, or utilized.

The drawings in the FIGS. represent the principles of embodiments, especially the structural details, schematically. Structural details of the devices and elements, as well as materials thereof, may be implemented and selected in any appropriate manner.

Figure 1:
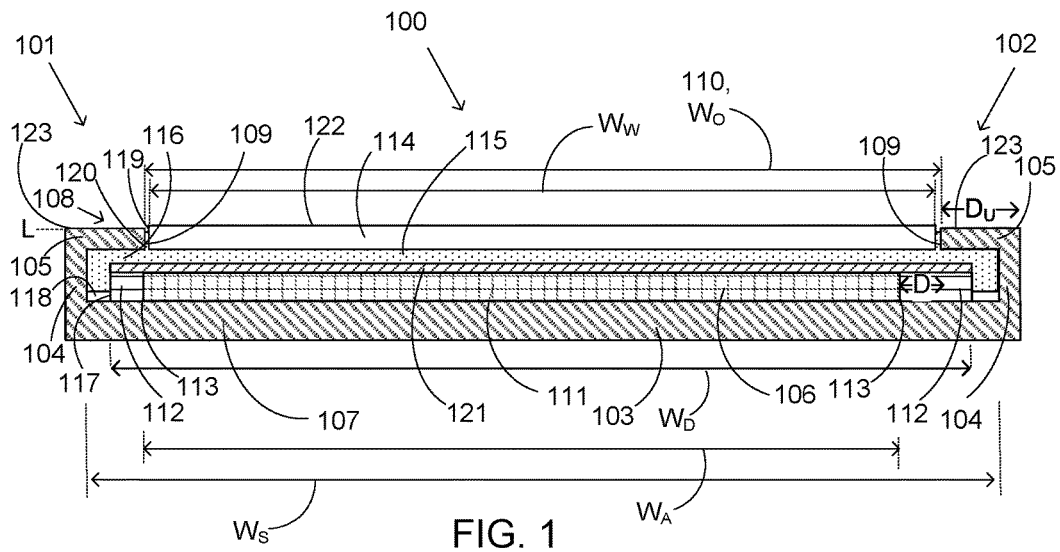
FIG. 1 illustrates a cross-sectional view of an electronic device according to an embodiment.

A cross-section along the width of an embodiment of an electronic device 100 is shown in FIG. 1. The electronic device 100 may be, for instance, a tablet computer, a smartphone or a mobile phone, a phablet, a media player, a personal digital assistant, an e-book reader, a game console, a wearable device, a display or a flat-screen television, but is not necessarily limited to these particular examples. The electronic device 100 may be a mobile device. The electronic device 100 has a substantially planar configuration and two or more, i.e. at least two, opposing sides 101 and 102. The opposing sides 101 and 202 thus form a pair of opposing sides, and the electronic device 100 thus comprises at least one pair of opposing sides 101 and 102. The electronic device 100 comprises a frame 103, the frame having a side portion 104 and an upper portion 105. The frame 103 at least partially surrounds a display module 106. The material of the frame may be any suitable material, such as aluminum, glass or plastic. The electronic device 100 may further comprise a window 114.

"Display module" in this specification refers generally to a display module or assembly comprising an electronic display element capable of displaying information to the outside of the electronic device into which it is incorporated. The display module may be based on any appropriate display technology, including, for example, LCD (Liquid Crystal Display), OLED (Organic Light-Emitting Diode), and AMOLED (Active-Matrix Organic Light-Emitting Diode), and any of their variants. For instance, an LCD display module may comprise a backlight, and an OLED display module may comprise an emissive display layer, two glass panels, a polarizer and optionally a protective layer. The display module may be a flexible display module, including, for example, a flexible plastic display module, a flexible electronic paper based display module, a flexible OLED-based display module, and any of their variants. The display module may comprise a passive display element for presenting information one-directionally only, without any interactivity. The display module may also comprise e.g. an interactive display, operable e.g. by touching it. Such touch display or touch screen, capable of providing a touch based user interface, may be based on any appropriate touch sensing technology, such as capacitive and resistive technologies and their variants. A touch-sensitive part or sensor may, in some embodiments, be provided as a separate layer or integrated in the window 114. A display module, such as that of FIG. 1, may comprise several structural and/or operational layers and partial elements depending e.g. on the display technology. For example, it may comprise, in the case of a touch screen, a touch sensitive layer and one or more display layers superposed on each other. However, merely for the sake of simplicity, in the FIGS. the display module 106 is depicted as a single layer although it may comprise a plurality of layers. The structure and shape of the display module 106 is generally plate-like or planar with its length and width being substantially larger than its thickness.

In this specification, "upper" or "up" refers to the direction and side towards which the display module displays information, when in use. Thus, the upper side of an electronic device refers to the side from which the user of the device can see the information displayed by the display module.

In this embodiment, the frame 103 further comprises a base portion 107 extending between the two opposing sides 101 and 102 of the electronic device 100 and connecting the side portion 104 at the two opposing sides 101 and 102. The display module 106 is disposed above the base portion 107. The base portion 107, the side portion 104 and the upper portion 105 are in this particular embodiment formed as a single piece, i.e. a unibody.

A part of the side portion 104 is disposed at the first opposing side 101 and another part of the side portion 104 is disposed at the second opposing side 102. They are therefore opposing each other at least partially. The side portion 104 may, in an embodiment, be a circumferential side portion, i.e. a side portion forming a closed circumference. Such a circumferential side portion could be considered to comprise or consist of two or more, such as four, parts of the side portion forming a continuous circumferential structure. In another embodiment, the side portion 104 may comprise or consist of at least two separate parts of the side portion 104 at the opposing sides 101 and 102. In any embodiment of the electronic device, the side portion 104 at the opposing sides 101, 102 of the electronic device 100 could also be considered as being a first side portion and a second side portion; however, such a first and second side portion could nonetheless be connected to each other and be a part of a continuous side portion 104, or they could be separate side portions at opposing sides 101, 102 of the electronic device 100 that are not directly connected to each other but connected via other parts of the electronic device, such as the base portion 107 of the frame 103. Such a first side portion and a second side portion may be opposing each other at least partially.

In a similar manner, a part of the upper portion 105 is disposed at the first opposing side 101 and another part of the upper portion 105 is disposed at the second opposing side 102. The upper portion 105 may, in an embodiment, be a circumferential upper portion, i.e. an upper portion forming a closed circumference. Such a circumferential upper portion could be considered to comprise or consist of two or more, such as four, parts of the upper portion forming a continuous circumferential structure. In another embodiment, the upper portion 105 may comprise or consist of at least two separate parts of the upper portion 105 at the opposing sides 101 and 102. In any embodiment of the electronic device, the upper portion 105 at the opposing sides 101, 102 of the electronic device 100 could be viewed as being a first upper portion and a second upper portion; however, such a first and second upper portion could nonetheless be connected to each other and be a part of a continuous upper portion 105, or they could be separate upper portions at opposing sides 101, 102 of the electronic device 100 that are not directly connected to each other but connected via other parts of the electronic device, such as the side portion 104 or the side portion 104 and the base portion 107 of the frame 103. Such a first upper portion and a second upper portion may be opposing each other at least partially.

The upper portion 105 extends, at each of the opposing sides 101, 102 of the electronic device 100, from the side portion 104 and towards the opposing side of the electronic device. The upper portion 105 is located on or at an upper side 108 of the electronic device. The upper portion 105 extends a determined distance from the side portion 104 and ends at an inner edge 109 of the upper portion 105. The inner edge or edges 109 of the upper portion 105 at the opposing sides 101, 102 define, at least partially, an opening 110 above the display module 106. The opening 110 has a width $W_O$.

The display module 106 is disposed within the frame 103. The display module 106 is planar or substantially planar. The display module 106 has a width $W_D$ and a length (not visible in this cross-sectional view) perpendicular to the width. The display module 106 has a central active area 111 for displaying information and an inactive area 112 not for displaying information. The active area 111 may comprise an array of pixels configured to display information. The active area 111 may be considered to be the area of the display module 106 usable for displaying information to a user of the electronic device 100, when in use. The inactive area 112, on the other hand, is not capable of displaying information. It may comprise, for example, electronic components required for the functioning of the active area, or it may comprise or consist of a dummy layer. The inactive area may be made black in color e.g. to match with the color of screen printing, which is often black and therefore often referred to as black printing, of the window of the electronic device in devices which include such screen printing. The inactive area is therefore often referred to as black matrix, but it is not necessarily black in color. The inactive area 112 is at the periphery of the display module 106, adjacent to the active area 111 and surrounding, at least partially or entirely, the active area 111. The active area 111 and the inactive area 112 are divided by a boundary 113. The inactive area 112 thus extends from the boundary 113 at the opposing sides 101, 102 of the electronic device 100 towards the side portion 104. In this exemplary embodiment, a polarizer layer 121 is disposed on the display module 106.

The display module 106 is disposed within the frame 103 so that at least a part of the inactive area 112 is disposed below and covered by the upper portion 105 of the frame 103, so that at least a part of the active area 111 is visible through the opening 110. Thus, at least a part of the active area 111 is configured to be viewable by and to display information to a user of the electronic device 100, when in use.

In an embodiment, at least a part of the inactive area 112 is disposed below and covered by the upper portion 105 of the frame 103 so that the upper portion 105 extends over the inactive area 112 at at least one side 101 of the electronic device towards the opposing side 102 of the electronic device to a distance of 0.2 mm from the active area 111, i.e. from the boundary 113, or further, so that at most 0.2 mm of the inactive area 112, i.e. of the width of the inactive area 112, at the at least one side 101 of the electronic device 100 is visible through the opening 110.

It is not necessary for the same width of the inactive area 112 to be visible at both opposing sides 101, 102, of the electronic device 100. In this exemplary embodiment, the upper portion 105 extends over the inactive area 112 at one side 101 of the electronic device towards the opposing side 102 of the electronic device so that the inner edge 109 of the upper portion 105 is substantially in alignment with or in alignment with the boundary 113. The upper portion 105 extends over the inactive area 112 at the other side 102 of the electronic device 100 towards the opposing side 101 of the electronic device 100 so that there is a distance D between the inner edge 109 of the upper portion 105 and the active area 111 (i.e. between the inner edge 109 and the boundary 113) in the horizontal direction. The distance D may be 0.2 mm or less. In such an embodiment, 0.2 mm or less of the inactive area 112 at side 102 of the electronic device 100 is visible through the opening 110. The distance D may thus be considered to be 0.2 mm or less at both opposing sides 101, 102 of the electronic device 100. In such an embodiment, 0.2 mm or less of the inactive area 112 at the at both opposing sides 101, 102 of the electronic device 100 is visible through the opening 110. Thus the dead border at the two opposing sides 101, 102 equals the combination of the distance D and the distance $D_U$ that the upper portion 105 extends from the side portion 104 towards the opposing side in the horizontal direction.

In an embodiment, the distance D is 0.1 mm or less, or 0.05 mm or less. In other words, in an embodiment, the upper portion 105 extends over the inactive area 112 at at least one side 102 of the electronic device towards the opposing side 101 of the electronic device to a distance of 0.1 mm from the active area 111, i.e. from the boundary 113, or further, so that at most 0.1 mm of the inactive area 112, i.e. the width of the inactive area 112, at the at least one side 102 of the electronic device 100 is visible through the opening 110. In an embodiment, the upper portion 105 extends over the inactive area 112 at at least one side 102 of the electronic device towards the opposing side 101 of the electronic device to a distance of 50 μm from the active area 111, i.e. from the boundary 113, or further, so that at most 50 μm of the inactive area 112, i.e. of the width of the inactive area 112, at the at least one side 102 of the electronic device 100 is visible through the opening 110.

In an embodiment, the boundary 113 is substantially in alignment with the inner edge 109 of the upper portion when the distance D between the inner edge 109 of the upper portion 105 and the active area 111 (i.e. between the inner edge 109 and the boundary 113) in the horizontal direction is less than 50 μm, or less than 25 μm, or less than 10 μm.

The less of the inactive area 112 at each side 101, 102 is visible, the narrower the dead border at the side. In other words, the smaller the distance D is, the narrower is the dead border at the side. With a narrower dead border, it may be possible to include a display module having a larger active area and/or to maximize the area of the active area relative to the entire area of the electronic device. When 0.2 mm or less of the inactive area 112 at at least one of the opposing sides 101, 102 of the electronic device 100 is visible through the opening 110, it may not be necessary to include screen printing on the window 114 on such side.

In this embodiment, the electronic device 100 further comprises a window 114. A "window" refers to an optical element which is at least partially transparent in the visible wavelength range so that at least part of visible light incident on the window may be transmitted through it. A window may be formed, for example, of a plastic or glass material. The thickness of the window 114 may depend e.g. on the type of the electronic device and its dimensions. For instance, for a mobile device, the thickness of the window may be e.g. 0.3 mm or greater. In this embodiment, the window 114 is disposed in the opening 110. In this exemplary embodiment, the window 114 has a thickness greater than the thickness of the upper portion 105. In this exemplary embodiment, the upper surface 122 of the window 114 is not flush with the upper edge(s) 123 of the upper portion 105, but the window 114 protrudes slightly at the upper side 108 of the electronic device 100. In a further embodiment, the upper surface 122 of the window 114 may be flush with the upper edge(s) 123 of the upper portion 105, i.e. the upper surface 122 may be at the same level L defined by the upper edge 123 of the upper portion 105. In a yet further embodiment, the upper surface 122 of the window 114 may be disposed below the level L defined by the upper edge 123 of the upper portion 105.

The window 114 has a width $W_W$. The width $W_W$ of the window 114 is smaller than the width $W_O$ of the opening 110. In an embodiment, the difference between the width of the opening $W_O$ and the width $W_W$ of the window 114 is less than 0.1 mm. In an embodiment, the difference between the width $W_O$ of the opening 110 and the width $W_W$ of the window 114 is less than 75 μm. In an embodiment, the difference between the width $W_O$ of the opening 110 and the width $W_W$ of the window 114 is less than 50 μm.

The width $W_D$ of the display module 106 is greater than the width $W_O$ of the opening 110. The width $W_A$ of the active area 111 may depend e.g. on the display technology. The width $W_A$ of the active area 111 may be smaller, greater, substantially equal or equal to the width $W_O$ of the opening 110, depending on the particular embodiment. In this exemplary embodiment, the active area 111 of the display module 106 has a width $W_A$ smaller than the width of the opening $W_O$. In order for the frame 103 to accommodate the display module 106, the distance $W_S$ between the parts of the side portion 104 at the two opposing sides 101, 102 is greater than the width $W_D$ of the display module 106. In an embodiment, the distance $W_S$ between the parts of the side portion 104 at the two opposing sides 101, 102 is at least 0.3 mm greater than the width $W_D$ of the display module 106. In an embodiment, the distance $W_S$ between the parts of the side portion 104 at the two opposing sides 101, 102 is at least 0.1 mm greater than the width $W_D$ of the display module 106.

As no inactive area or only at most 0.2 mm of the inactive area at the at least one side of the electronic device may be visible through the opening, there may be no need to include any screen printing on the window 114 along its width to cover the inactive area so that it is not visible. The entire width $W_W$ of the window 114 may thus be transparent.

The window 114 is disposed on the display module 106. The window 114 may be attached to the electronic device 100 in various ways. In this embodiment, the window 114 is laminated to the display module 106 using an optically clear resin (OCR). Various suitable optically clear resins are commercially available and may have various chemical compositions; an example of a suitable optically clear resin is ultraviolet (UV) curable OCR commercially available under the name TESK UV Resin, but various other optically clear resins from other manufacturers such as Dexerials Corp. are also available and may be contemplated. In this specification, "optically clear resin" refers to a resin material which is at least partially transparent in the visible wavelength range so that at least part of visible light incident on the window may be transmitted through it. Such an optically clear resin may have a light transmittance of at least 95%. However, other resins or adhesives having suitable properties could also be contemplated. The optically clear resin is present as a layer 115 of cured optically clear resin. The layer 115 of cured optically clear resin extends between the display module 106 and the window 114, thereby attaching the window 114 to the display module 106.

The layer 115 may, in an embodiment, be disposed directly on the surface of the display module 106, but further layers may, in other embodiments, be disposed between the display module 106 and the layer 115. For example, a touch-sensitive part or sensor may, in some embodiments, be provided as a separate layer on the display module 106 and therefore be disposed between the display module 106 and the layer 115.

The upper portion 105 and the display module 106 define a gap 116 thereinbetween at at least one, i.e. one or more, of the opposing sides 101, 102 of the electronic device 100. The layer 115 of cured optically clear resin may further extend between the display module 106 and the upper portion 105, i.e. into the gap 116, so that it fills the gap 116 partially or fully at at least one of the opposing sides 101, 102 of the electronic device 100.

The side portion 104 and the peripheral edge 117 of the display module 106, and optionally also the base portion 107, define an interspace 118 thereinbetween at at least one of the opposing sides 101, 102 of the electronic device 100. The layer 115 of cured optically clear resin may further extend between the display module 106, i.e. the peripheral edge 117, and the side portion 105, i.e. into the interspace 118, at at least one of the opposing sides 101, 102 of the electronic device 100. Such a layer of optically clear resin may function as a protective cushion or bumper for the display module 106 and possibly other parts or components of the electronic device, as it may help in absorbing any shocks that the electronic device might receive when in use, for instance if falling and hitting a hard surface.

The peripheral edges 119 of the window 114 and the inner edge or edges 109 of the upper portion 105 define a gap 120 thereinbetween at each side 101, 102 of the electronic device 100. The layer 115 of cured optically clear resin may also extend between the window 114 and the inner edge 109 of the upper portion 105, i.e. into the gap 120 at at least one of the opposing sides 101, 102 of the electronic device 100. As described below, the dimensions of the electronic device, such as the dimensions of the gaps 116 and 120 and the interspace 118, may be selected so that a larger portion of the optically clear resin extends between the display module and the upper portion, and optionally between the display module and the side portion, than between the window and the inner edge(s) of the upper portion.

Figure 2:
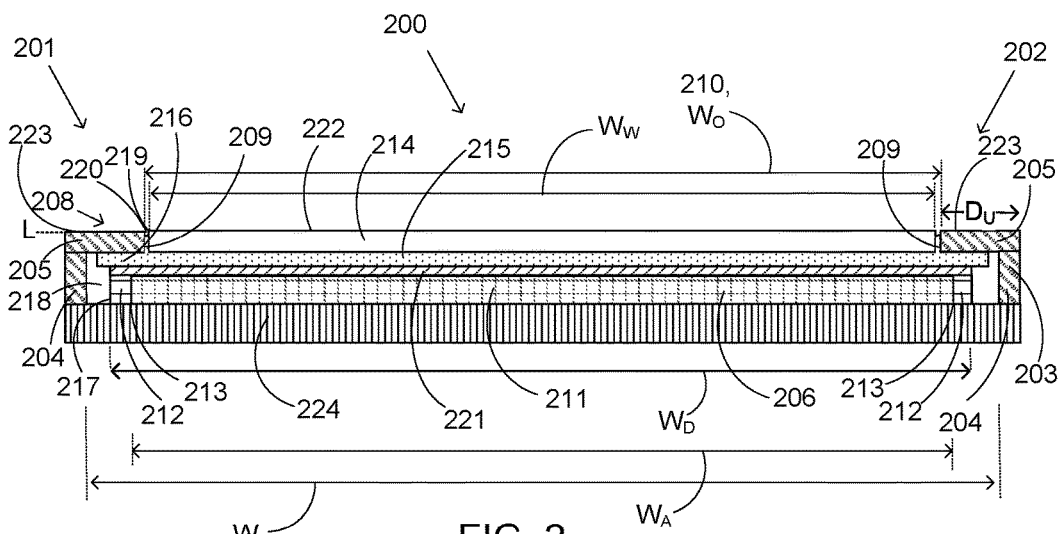
FIG. 2 illustrates a cross-sectional view of an electronic device according to an embodiment.

The exemplary embodiment of the electronic device 200 shown in FIG. 2 differs from that of FIG. 1 at least in that the frame 203 comprises a side portion 204 and an upper portion 205 but not a base portion. The side portion 204 and the upper portion 205 at the opposing sides 201, 202 of the electronic device 200 are, in this particular embodiment, formed as separate pieces connected or attached to each other. However, they could also be formed as a single piece. The electronic device 200 further comprises a separate cover plate 224 extending below, when in use, the display module 206 between the opposing sides 201, 202 of the electronic device 200. The cover plate 224 may be removably or irremovably connected or attached to the frame 203, such as to the side portion 204.

The exemplary embodiment of the electronic device 200 shown in FIG. 2 differs from that of FIG. 1 also in that the active area 211 of the display module 206 has a width $W_A$ greater than the width of the opening $W_O$. Further, in this embodiment, a part of the active area 211 extends behind and is covered by the upper portion 205 at each opposing side 201, 202 of the electronic device 200 so that the part of the active area 211 is not visible. The entire inactive area 212 at the opposing sides 201, 202 of the electronic device 200 is thus disposed behind and is covered by the upper portion 205. In such an embodiment, the part of the display module 206 that is visible through the opening 210 consists of a part of the active area 211. As a part of the active area 211 is not visible, the electronic device 200 may be configured to not display information at the part of the active area 211 that is not visible.

In another embodiment, a part of the active area 211 may extend behind and be covered by the upper portion 205 at at least one opposing side 201, 202 of the electronic device 200 so that the part of the active area 211 is not visible, while at the opposing side, the upper portion may extend over the inactive area at towards the opposing side of the electronic device to a distance of 0.2 mm from the active area or further, so that at most 0.2 mm of the inactive area at the at least one side of the electronic device is visible through the opening. In yet another embodiment, a part of the active area 211 may extend behind and be covered by the upper portion 205 at at least one opposing side 201, 202 of the electronic device 200 so that the part of the active area 211 is not visible, while at the opposing side, the active area 211, i.e. the boundary 213, is in alignment with or substantially in alignment with the inner edge 209 of the upper portion 205.

The exemplary embodiment of the electronic device 200 shown in FIG. 2 differs from that of FIG. 1 also in that the upper surface 222 of the window 214 is flush with the upper edge(s) 223 of the upper portion 205. In other words, the upper surface 222 of the window is at the level L defined by the upper edge 223 of the upper portion 205. In such an embodiment, the upper part 208 of the electronic device 200 may feel seamless, i.e. the junction between the window 214 and the upper portion 205 may feel seamless.

The exemplary embodiment of the electronic device 200 shown in FIG. 2 differs from that of FIG. 1 also in that the layer 215 of the cured optically clear resin does not extend between the display module 206 and the side portion 204. Other aspects of the embodiment shown in FIG. 2 are generally similar to those of the embodiment shown in FIG. 1.

Figure 3:
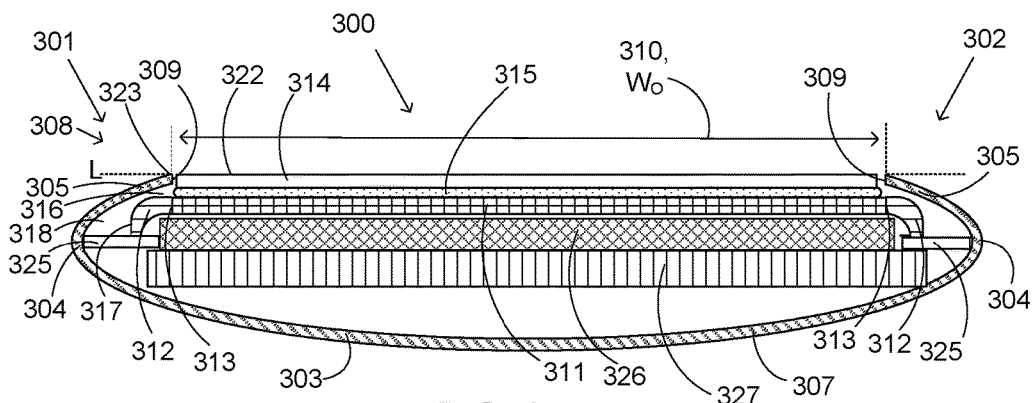
FIG. 3 illustrates a cross-sectional view of an electronic device according to an embodiment.

The exemplary embodiment of the electronic device 300 shown in FIG. 3 differs from that of FIGS. 1 and 2 at least in that the display module 306 is not entirely planar. The display module 306 and in particular the active area 311 is substantially planar, but at the peripheral edges 317 the display module 306 is curved downwards. Such a curved display module 306 may be made from any suitable material, e.g. a flexible or bendable plastic material. The display module 306 is disposed and rests on support members 325, such as ledges, at the two or more opposing sides 301, 302 of the electronic device 300. Further parts and components 326, 327 of the electronic device may be disposed below the display module 306. In this exemplary embodiment, the frame 303, including the base portion 307, the side portion 304 and the upper portion 305, is also curved.

The exemplary embodiment of the electronic device 300 shown in FIG. 3 differs from that of FIGS. 1 and 2 also in that the boundary 313 dividing the active area 311 and the inactive area 312 is in alignment with or substantially in alignment with the inner edge 309 of the upper portion 305. The boundary 313 is in alignment with the inner edge 309 at both opposing sides 301, 302 of the electronic device 300. The width of the active area $W_A$ is thus equal or substantially equal to the width $W_O$ of the opening 310.

In an embodiment, the boundary 313 is substantially in alignment with the inner edge 309 of the upper portion when the distance D between the inner edge 309 of the upper portion 305 and the active area 311 (i.e. between the inner edge 309 and the boundary 313) in the horizontal direction is less than 50 µm, or less than 25 µm, or less than 10 µm.

In this embodiment, the upper surface 322 of the window 314 is flush with the upper edge(s) 323 of the upper portion 305. In this embodiment, the layer 315 of the cured optically clear resin extends between the window 314 and the display module 306 only. It does not extend between the display module 306 and the upper portion 305. It also does not extend between the display module 306 and the side portion 304.

FIG. 4 illustrates a top view of an electronic device 400. In this exemplary embodiment, the electronic device 400 is substantially rectangular with rounded corners, but the device 400 may also be otherwise shaped, for example, triangle shaped, circular or oval, and corners, if any, may be angular as opposed to rounded. The opposing sides 401, 402 are the longitudinal sides of the electronic device 400, and the upper portion 405 is a circumferential upper portion.

Figure 4A:
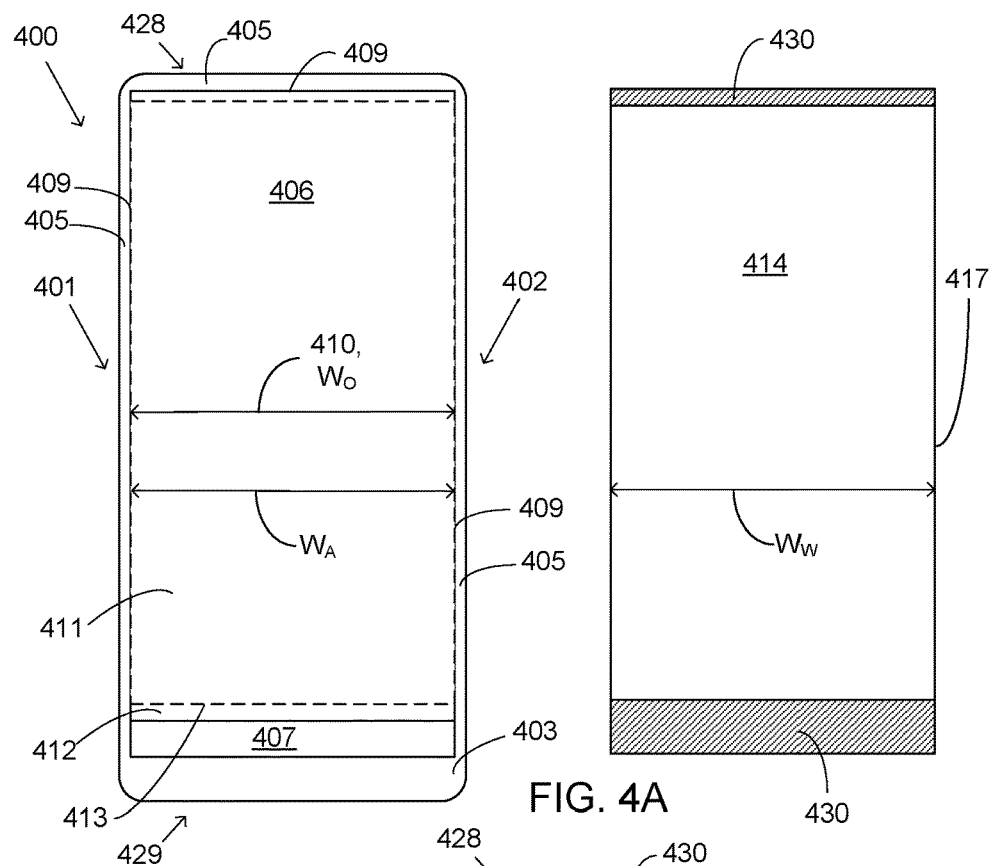
FIGS. 4A and 4B show a top view of an electronic device according to an embodiment.

In FIG. 4A, the electronic device 400 is shown with the display module 406 being disposed within the frame 403 so that at least a part of the inactive area is disposed below and covered by the upper portion 405 of the frame, at least a part of the active area being visible through the opening 410 having a width $W_O$. In this embodiment, the width $W_O$ is substantially equal to the width $W_A$ of the active area 411 such that, at two opposing sides 401, 402 of the electronic device 400, substantially the entire inactive area 412 is disposed below and covered by the upper portion 405 of the frame 403, and substantially the entire active area 411 is visible through the opening 410. At the sides 428, 429 perpendicular to the longitudinal sides 401, 401 the upper portion 405 covers only a part of the inactive area 412, so that more than 0.2 mm of the inactive area 412 is visible at these sides 428, 429.

In FIG. 4A, the window 414 is shown separately alongside the electronic device 400. The window 414 is transparent along the entire width $W_W$, i.e. no screen printing is disposed perpendicular to the width $W_W$ of the window 414 to be disposed between the inner edge(s) 409 of the upper portion 405. In this embodiment, strips of screen printing 430, such as black printing, are disposed at the ends of the window 414 for covering the inactive area 412 at the edge of the display module 406 parallel to its width $W_D$, the strips of screen printing 430 being thus parallel to the width $W_W$ of the window 414.

Figure 4B:
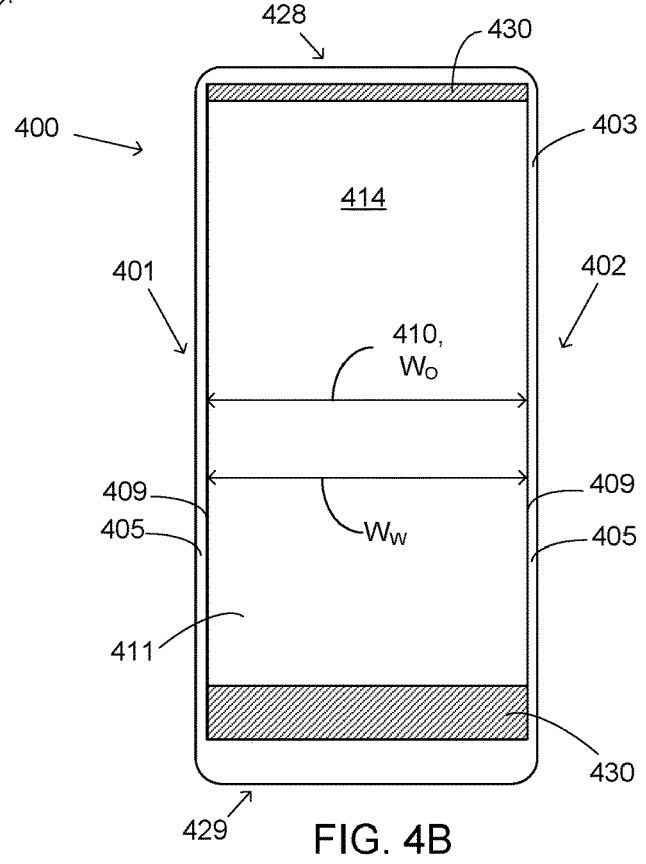

In FIG. 4B, the electronic device 400 is shown with the window 414 disposed in the opening 410. Substantially the entire active area 411 is visible through the window 414. The strips of screen printing 430 cover the inactive area 412 (thus not visible) at the sides 428, 429 perpendicular to the longitudinal sides 401, 401 of the electronic device 400.

Figure 5:
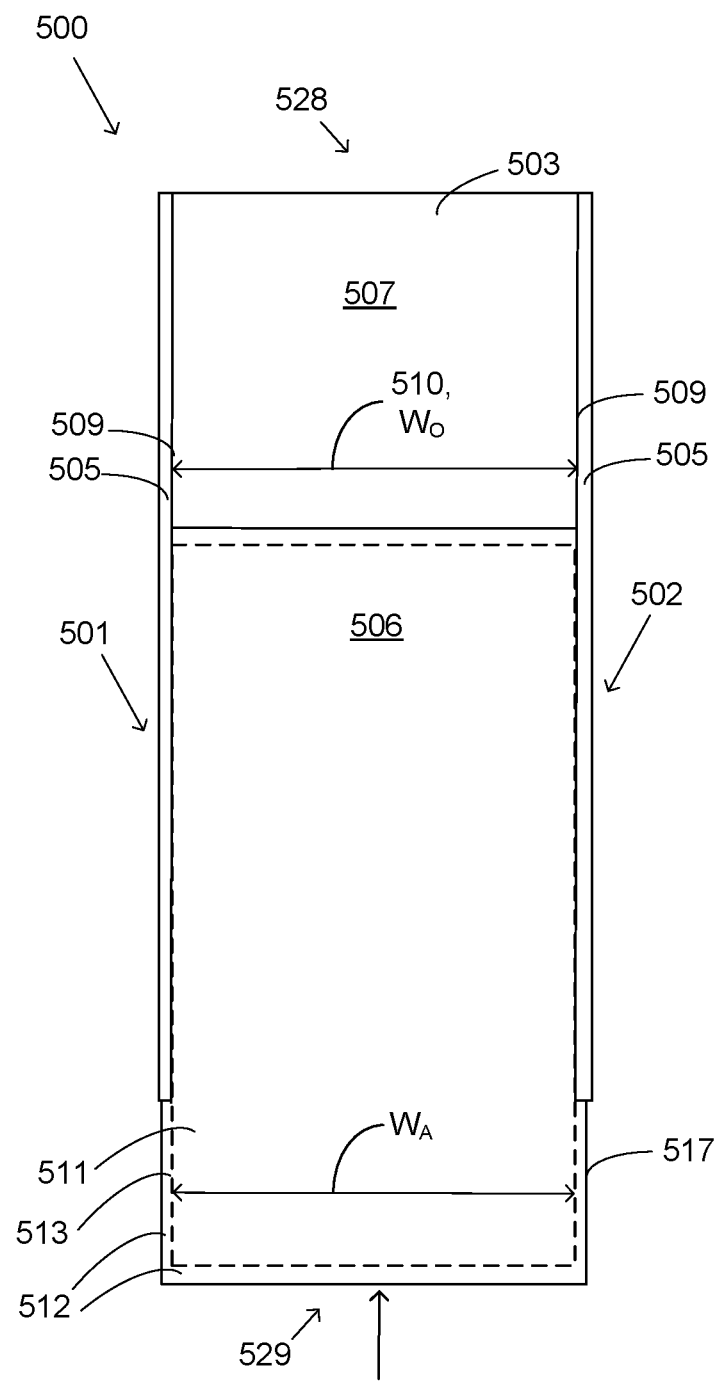
FIG. 5 shows a top view of an electronic device according to an embodiment.

The exemplary embodiment of the electronic device 500 shown in FIG. 5 without a window differs from that of FIG. 4A at least in that the upper portion 505 and the side portion 504 (not visible) is disposed only at the two opposing longitudinal sides 501, 502 of the electronic device 500, the upper portion 505 thus extending from the side portion only at the two opposing sides 501, 502 and not at the sides 528, 529 perpendicular to the longitudinal sides 501, 502 of the electronic device 500. The side portion 504 in this embodiment could thus be considered to comprise or consist of a first part of the side portion 504 or a first side portion at the first side 501 of the electronic device 500 and a second part of the side portion 504 or a second side portion at the second side 502. FIG. 5 also illustrates an embodiment of a method for manufacturing an electronic device 500. In FIG. 5, the display module 506 is placed within the frame 503 by sliding the display module 506 within the side portion 504 at the two or more opposing sides 501, 502 of the electronic device 500. The direction to which the display module 506 is slid is depicted by the arrow. The display module 506 may be slid into the space between the side portion 504 at the two opposing sides 501, 502 from either side 528, 529 perpendicular to the longitudinal sides 501, 502 as the upper portion 505 and the side portion 504 (not visible) are disposed and extend only at the two opposing longitudinal sides 501, 502 of the electronic device 500. Alternatively, the side portion 504 could also be disposed and extend at a third side of the electronic device, e.g. side 528, provided that a fourth side 529 perpendicular to the longitudinal sides 501, 502 would be unobstructed so that the display module 506 could be slid below the upper portion 505 from the fourth side 529.

In order for the frame 503 to accommodate the display module 506, the distance $W_S$ between the parts of the side portion 504 (not visible) at the two opposing sides 501, 502 is greater than the width $W_D$ of the display module 506. In an embodiment, the distance $W_S$ between the parts of the side portion 504 at the two opposing sides 501, 502 is at least 0.3 mm greater than the width $W_D$ of the display module 506. In an embodiment, the distance $W_S$ between the parts of the side portion 504 at the two opposing sides 501, 502 is at least 0.1 mm greater than the width $W_D$ of the display module 506.

Figure 6:
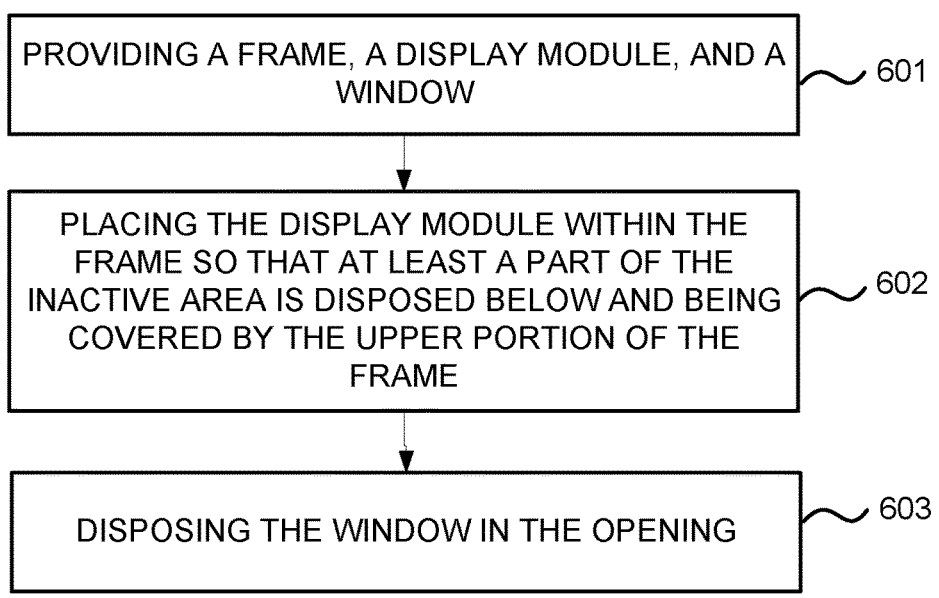
FIG. 6 illustrates, as a flow chart, a manufacturing method according to an embodiment.

FIG. 6 illustrates a method for manufacturing an electronic device. The method comprises providing a frame, a display module and a window at 601; placing the display module within the frame so that at least a part of the inactive area is disposed below and covered by the upper portion of the frame at 602; and disposing the window in the opening at 603. Said operations of the method may be performed sequentially.

Figure 7A:
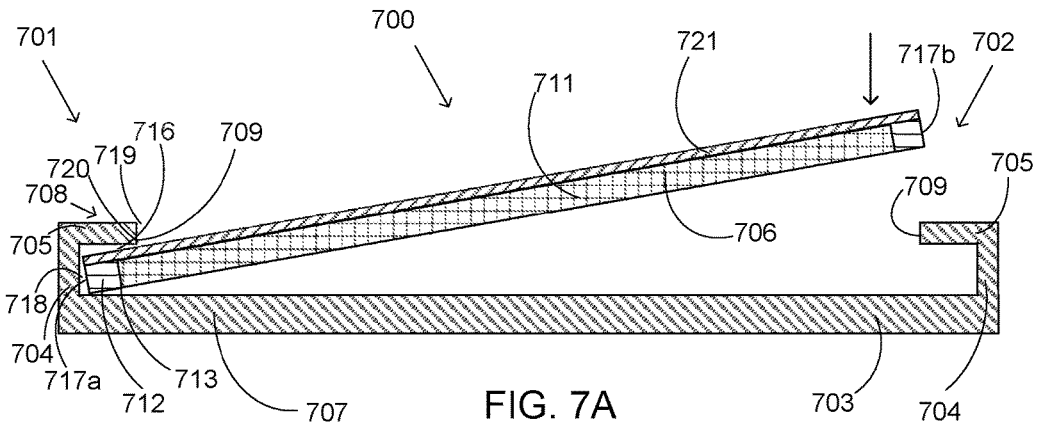
FIGS. 7A to 7C illustrate a cross-sectional view of an electronic device and a manufacturing method thereof, according to an embodiment.
Figure 7B:
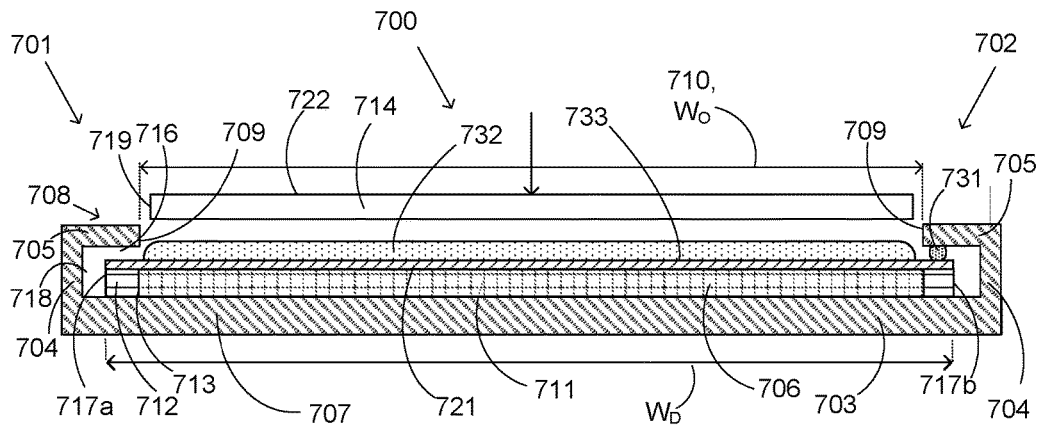
Figure 7C:
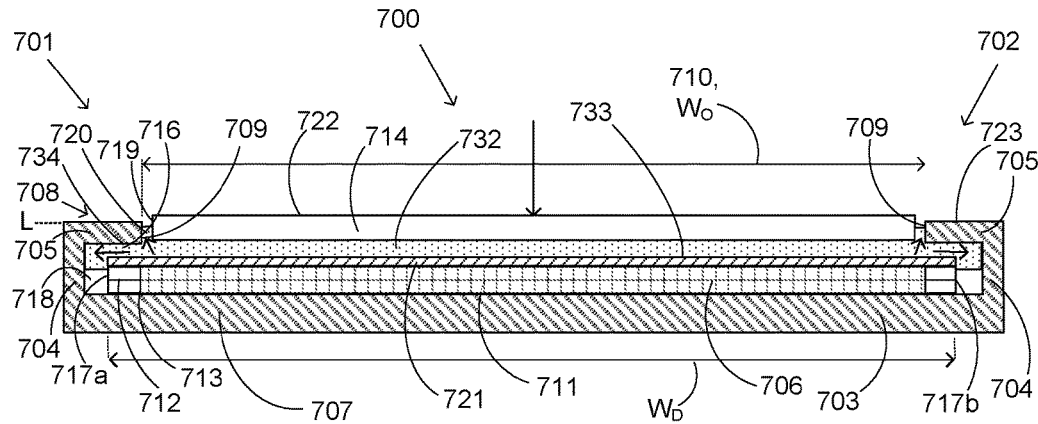

FIGS. 7A to 7C illustrate a method for manufacturing an electronic device 700. In this exemplary embodiment, the electronic device 700 is similar to that shown in FIG. 1, but the method may be contemplated also for manufacturing any of the electronic devices shown in FIGS. 2 to 5.

In FIG. 7A, shown in a cross-sectional view, the display module 706 is disposed within the frame 703 by placing a first peripheral edge 717a of the display module 706 under the upper portion 705 at one of the opposing sides 701 of the electronic device 700 and tilting the display module 706 so that the second peripheral edge 717b of the display module 706 is disposed below the upper portion 705 at the opposing side 702. In such an embodiment, the width $W_D$ and other dimensions of the display module 706, such as its thickness, and the width $W_O$ of the opening 710 may be selected so that it is possible to dispose the display module 706 within the frame 703 by tilting in this manner.

In FIG. 7B, when the display module 706 is disposed within the frame 703, it may be positioned within the frame 703. The positioning may be done by measuring accurately the positions of the inner edges 709 of the upper portion 705 defining the opening 710 at a plurality of locations, e.g. at four locations, to define the midpoint (at the position indicated with the arrow) of the opening 710. Subsequently at least one of the peripheral edges 717a, 717b or both peripheral edges of the display module 706 may be aligned with the at least one of the inner edges 709 of the opening 710 or with the midpoint so that they are parallel or substantially parallel. In an embodiment, one, two, or three peripheral edges 717a, 717b (the third and fourth peripheral edges not being visible in this cross-sectional view) of the display module 706 are aligned with the at least one of the inner edges 709 of the opening 710 or with the midpoint so that they are parallel or substantially parallel. Such positioning may be relatively accurate, e.g. it may have a tolerance of less than 10 μm, or less than 5 μm. The alignment may be done using a camera, such as a regular light camera. A sucking member or another suitable member can be used to move the display module 706 in the horizontal and/or vertical direction to position it.

When the display module 706 is disposed within the frame 703, the display module 706 may be positioned within the frame 703 so that at least a part of the inactive area 712 is disposed below and is covered by the upper portion 705 of the frame 703 so that the upper portion 705 extends over the inactive area 712 at at least one side 701, 702 of the electronic device 700 towards the opposing side of the electronic device to a distance of 0.2 mm from the active area 711 or further, so that at most 0.2 mm of the inactive area 712 at the at least one side of the electronic device is visible through the opening 710.

In an embodiment, the display module 706 is positioned so that the active area 711 and the inactive area 712 are divided by a boundary 713, and the boundary 713 at at least one side of the electronic device 700 is, or at both opposing sides 701, 702 are, in alignment with the inner edge 709 of the upper portion 705.

In an embodiment, the display module 706 is positioned so that a part of the active area 711 extends behind and is covered by the upper portion 705 at at least one of the opposing sides 701, 702 of the electronic device 700, or at both opposing sides 701, 702, so that the part of the active area 711 is not visible.

In FIG. 7B, with the display module 706 disposed within the frame 703, the window 714 may be attached to the electronic device 700. The display module 706 may, prior to disposing and attaching of the window 714, be attached to the frame 703 using any suitable attachment arrangement 731, e.g. glue or other suitable adhesive. "Adhesive" in this specification refers to any material capable of providing sufficient adhesive forces for attaching two bodies together. The glue may be any suitable glue, such as an UV curable glue. The glue or another suitable adhesive may be disposed between the upper portion 705 and the display module 706 at a location or a plurality of locations along the upper portion 705, e.g. at one, two or more locations at two or more opposing sides 701, 702 of the electronic device 700. The adhesive or glue may be disposed as distinct drops. The adhesive or glue may be pre-hardened, e.g. by exposure to suitable conditions, such as by irradiating with UV light. After the display module 706 is positioned as desired, the attachment arrangement 731 may retain it in place within the frame 703 during any subsequent manufacturing phases. As shown in FIG. 7B, the attachment arrangement 731 may be disposed below the upper portion 705 so that it is not visible.

The window 714 is laminated to the display module 706 with the display module being disposed within the frame 703, as opposed to laminating the window 714 to the display module 706 first and then disposing the window 714 and display module 706 laminated to each other within the frame 703.

In this exemplary embodiment, the window 714 is laminated to the display module using an optically clear resin. Optically clear resin, i.e. uncured optically clear resin, may be spread on the display module 706 as a layer 732. The layer 732 may have a substantially uniform thickness. Such a layer may be spread e.g. using a slit coating nozzle or any other suitable nozzle or spreading apparatus. The layer 732 may, in an embodiment, be spread directly on the surface of the display module 706, but further layers may, in other embodiments, be disposed between the display module 706 and the layer 732. For example, a touch-sensitive part or sensor may, in some embodiments, be provided as a separate layer on the display module 706 and therefore be disposed between the display module 706 and the layer 732. The layer 732 of uncured optically clear resin may cover substantially the entire upper surface 733 of the display module 706. However, the layer 732 does not necessarily have to cover substantially the entire upper surface 733 of the display module 706. The layer 732 may also have an overall shape or pattern other than the overall shape of the display module 706. For instance, when the display module is rectangular, the layer does not necessarily have to be rectangular, but it may have an irregular pattern. The amount of the optically clear resin to be added into the layer 732 may be determined by calculating the nominal volume of the optically clear resin and by dispensing a suitable volume, taking into account any desired overflow as described below and other aspects of the geometry of the parts and components. The window 714 may be lowered with the display module 706 being disposed within the frame 703 so that the optically clear resin is spread essentially evenly along the entire upper surface 733 of the display module 706.

Uncured optically clear resin is liquid and flowable. Cured optically clear resin is not flowable and may have a solid appearance.

The viscosity of the optically clear resin may be e.g. 3500 to 5000 mPa·s. The viscosity may be measured at 25° C. Such an optically clear resin may have suitable properties for spreading into a layer or for directing the flow of the optically clear resin upon lowering the window 714. Such an optically clear resin may also exhibit less tendency to leak into locations in which the presence of the optically clear resin is not desirable, such as above the window 714 and/or the upper edge 723 of the upper portion 705 through the gap 720 between the peripheral edges 719 of the window 714 and the inner edge or edges 709 of the upper portion 705. However, a viscosity below 3500 mPa·s, such as a viscosity between 1000-3500 mPa·s, may also be contemplated. A viscosity above 5000 mPa·s may also be contemplated. The layer 732 of optically clear resin may, in an embodiment, be pre-cured, i.e. at least partially cured, prior to disposing the window 714 in the opening 710 to reduce the ability of the optically clear resin to flow. After such a pre-curing, e.g. a 10% pre-curing, the optically clear resin is not fully cured but is still substantially flowable to some extent. Such a pre-cured optically clear resin may have a gel-like consistency. Pre-curing the optically clear resin prior to disposing the window 714 may also shrink the optically clear resin to some extent, e.g. 1-2% of the total volume of the optically clear resin, so that the shrinkage during the final curing of the optically clear resin may be reduced.

As shown in FIG. 7C, the window 714 may be disposed in the opening 710 by lowering it towards the display module 706 from above, i.e. in the direction of the arrow. A sucking member or another suitable member can be used to lower the window 714 and position it within the opening 710. Upon lowering the window 714, the window 714 may exert a force on the layer 732 of optically clear resin, and the layer 732 may spread along the display module 706. Thus upon lowering the window 714 a portion of the optically clear resin may be directed between the display module 706 and the upper portion 705. The window 714 may, in some embodiments, be lowered into the opening 710 so that a portion of the optically clear resin 732 is directed between the display module 706 and the side portion 704 as indicated by the arrows. This may allow for directing any overflow of the optically clear resin into spaces where it does not cause any adverse consequences, such as smearing parts of the electronic device 700 that are visible. Further, the presence of the optically clear resin between the display module 706 and the upper portion 705 and optionally between the display module 706 and the side portion 704 may function as a protective cushion or bumper for the display module 706 and possibly other components of the electronic device, as it may help in absorbing any shocks that the electronic device might receive when in use, for instance by falling and hitting a hard surface.

In an embodiment, upon lowering the window 714 into the opening 710, a larger portion of the optically clear resin is directed between the display module 706 and the upper portion 705 than between the window 714 and the inner edge(s) 709 of the upper portion 705 at at least one of the opposing sides 701, 702 of the electronic device 700.

The upper portion 705 and the display module 706 define a gap 716 therebetween at each side 701, 702 of the electronic device 700. The dimensions of the gap 716, and in particular the distance between the display module 706 and the lower edge 734 of the upper portion 705, may be selected so that a portion of the layer 732 of optically clear resin may further extend between the display module 706 and the upper portion 705, i.e. into the gap 716, so that it fills the gap 716 partially or fully at at least one of the opposing sides 701, 702, or at both opposing sides 701, 702, of the electronic device 700.

The side portion 704 and the peripheral edge 717a, 717b of the display module 706, and optionally also the base portion 707, define an interspace 718 therebetween at at least one of the opposing sides 701, 702 of the electronic device 700. The dimensions of the interspace 718, and in particular the distance between the display module 706 and the side portion 704, may be selected so that a portion of the layer 732 of optically clear resin may further extend between the display module 706, i.e. the peripheral edge 717a, 717 b, and the side portion 705, i.e. into the interspace 718, at at least one of the opposing sides 701, 702, or at both opposing sides 701, 702, of the electronic device 700.

The peripheral edges 719 of the window 714 and the inner edge or edges 709 of the upper portion 705 define a gap 720 therebetween at at least one of the opposing sides 701, 702 of the electronic device 700. The layer 732 of optically clear resin may also extend into the gap 720 at at least one of the sides 701, 702, or at both opposing sides 701, 702, of the electronic device 700. The dimensions of the electronic device 700, such as the dimensions of the gaps 116 and 120 and the interspace 118, may be selected so that a larger portion of the optically clear resin is directed between the display module 706 and the upper portion 705 (and optionally between the display module 706 and the side portion 704) than between the window 714 and the inner edge(s) 709 of the upper portion 705. In an embodiment, the distance between the peripheral edge or edges 719 of the window 714 and the inner edge or edges 709 of the upper portion 705 is smaller than the distance between the display module 706 and the lower edge 734 of the upper portion 705.

In further embodiments, the optically clear resin may be directed preferably towards the opposing sides 701, 702 of the electronic device 700 rather than towards the sides 728, 729 perpendicular to the opposing sides. A suitable restricting arrangement (not shown in this cross-section), e.g. one or more portions of tape, may be arranged to restrict flow of optically clear resin towards certain directions and locations. The optically clear resin may also be directed towards certain directions, such as areas with certain components for which it may act as a support material.

When the window 714 is disposed in the opening 710, it may be positioned within the opening 710. The positioning may be done by measuring accurately the positions of the inner edges 709 of the upper portion 705 defining the opening 710, e.g. at four locations to define the midpoint (at the position indicated with the arrow) of the opening 710. Subsequently at least one of the peripheral edges 719 or both peripheral edges of the window 714 may be aligned with the at least one of the inner edges 709 of the opening 710 or with the midpoint so that they are parallel or substantially parallel. In an embodiment, one, two, or three peripheral edges 719 of the window 714 are aligned with the at least one of the inner edges 709 of the opening 710 or with the midpoint so that they are parallel or substantially parallel. Such positioning may be relatively accurate, e.g. it may have a tolerance of less than 10 μm, or less than 5 μm. The alignment may be done using a camera, such as a regular light camera. A sucking member or another suitable member can be used to move the window 714 in the horizontal and/or vertical direction to position it.

In an embodiment, the window 714 is disposed in the opening 710 so that the upper surface 722 of the window 714 is flush with the upper edge 723 of the upper portion 705.

With the window 114 disposed within the opening, the optically clear resin may be cured, thereby attaching the window 714 to the display module 706. The optically clear resin may be cured by exposure to one or more suitable curing conditions. For instance, the curing conditions may include irradiating with ultraviolet (UV) light, subjecting to moisture, subjecting to heat, applying a primer, or any combinations thereof. The curing conditions may be selected depending on the optically clear resin used.

In an embodiment, the optically clear resin is a dual curing resin, i.e. a resin curable by exposure to at least two different curing conditions. Exposure to first curing conditions, such as conditions including irradiating with ultraviolet light, may cure a portion of the optically clear resin that is visible through the opening 710. Exposure to second curing conditions may be suitable for curing portions of the optically clear resin that are disposed below and being covered by the frame 703, thereby not being curable by the first curing conditions. The second curing conditions may then be selected so that they are capable of curing portions of the optically clear resin that are disposed below and being covered by the frame 703, i.e. the shadow area. In an embodiment, the dual curing resin is curable by exposure to first curing conditions, such as ultraviolet light, and by exposure to second curing conditions, and the method comprises a first curing by irradiating the optically clear resin with ultraviolet light, and a second curing by exposing the optically clear resin to the second curing conditions, thereby curing portions of the optically clear resin that are disposed below and being covered by the frame, thereby not being curable by the ultraviolet light. The second curing conditions may include e.g. subjecting to moisture, subjecting to heat, applying a primer, or any combinations thereof.

The method depicted in FIGS. 6 and 7A to 7C and various embodiments thereof may be optimized for a continuous manufacturing process.

Some embodiments are further discussed shortly in the following.

According to a first aspect, an electronic device may have two or more opposing sides, the electronic device comprising a display module having a width and a length, a window on the display module, and a frame at least partly surrounding the display module, the frame comprising, at two or more opposing sides of the electronic device, a side portion and an upper portion on an upper side of the electronic device, the upper portion extending a determined distance from the side portion towards the opposing side of the electronic device and ending at an inner edge of the upper portion, and the inner edge of the upper portion defining an opening having a width smaller than the width of the display module; and the display module having an active area and an inactive area adjacent to the active area and at the periphery of the display module; wherein the display module is disposed within the frame so that at least a part of the inactive area is disposed below and covered by the upper portion of the frame, at least a part of the active area being visible through the opening, and the window is disposed in the opening.

In an embodiment, at least a part of the inactive area is disposed below and covered by the upper portion of the frame so that the upper portion extends over the inactive area at at least one side of the electronic device towards the opposing side of the electronic device to a distance of 0.2 mm from the active area or further, so that at most 0.2 mm of the inactive area at the at least one side of the electronic device is visible through the opening.

In an embodiment which may be in accordance with the preceding embodiment, the upper portion extends over the inactive area at at least one side of the electronic device towards the opposing side of the electronic device to a distance of 0.2 mm from the active area or further, so that at most 0.2 mm of the inactive area at the at least one side of the electronic device is visible through the opening.

In an embodiment which may be in accordance with any of the preceding embodiments, the active area and the inactive area are divided by a boundary, and the boundary is in alignment with the inner edge of the upper portion.

In an embodiment which may be in accordance with any of the preceding embodiments, a part of the active area extends behind and is covered by the upper portion at at least one of the opposing sides of the electronic device so that the part of the active area is not visible.

In an embodiment which may be in accordance with any of the preceding embodiments, the window is laminated to the display module using an optically clear resin.

In an embodiment which may be in accordance with any of the preceding embodiments, the window is laminated to the display module using a layer of cured optically clear resin extending between the display module and the window, thereby attaching the window to the display module, and between the display module and the upper portion.

In an embodiment which may be in accordance with any of the preceding embodiments, the layer of cured optically clear resin extends between the display module and the side portion.

In an embodiment which may be in accordance with any of the preceding embodiments, the window has an upper surface, and the upper portion has an upper edge; and the upper surface of the window is flush with the upper edge of the upper portion.

In an embodiment which may be in accordance with any of the preceding embodiments, the window has a width, and the entire width of the window is transparent.

In an embodiment which may be in accordance with any of the preceding embodiments, the frame is a unibody.

According to a second aspect, a method for manufacturing an electronic device having two or more opposing sides comprises providing a frame, a display module having a width and a length, and a window; the frame comprising, at two or more opposing sides of the electronic device, a side portion and an upper portion on an upper side of the electronic device, the upper portion extending a determined distance from the side portion towards the opposing side of the electronic device and ending at an inner edge of the upper portion, and the inner edges of the upper portion defining an opening having a width smaller than the width of the display module; the display module having an active area and an inactive area adjacent to the active area and at the periphery of the display module; placing the display module within the frame so that at least a part of the inactive area is disposed below and covered by the upper portion of the frame, at least a part of the active area being visible through the opening, and disposing the window in the opening.

In an embodiment, the method comprises disposing the window in the opening with the display module being disposed within the frame.

In an embodiment which may be in accordance with the preceding embodiment, the method comprises disposing the window in the opening by laminating the window to the display module using an optically clear resin with the display module being disposed within the frame. In an embodiment which may be in accordance with any of the preceding embodiments, the method comprises spreading the optically clear resin into a layer on the display module, with the display module being disposed within the frame; lowering the window into the opening so that a portion of the optically clear resin is directed between the display module and the upper portion; and curing the optically clear resin, thereby attaching the window to the display module.

In an embodiment which may be in accordance with any of the preceding embodiments, the method comprises spreading the optically clear resin into a layer having a substantially uniform thickness on the display module, with the display module being disposed within the frame; lowering the window into the opening so that a portion of the optically clear resin is directed between the display module and the upper portion; and curing the optically clear resin, thereby attaching the window to the display module.

In an embodiment which may be in accordance with any of the preceding embodiments, the method comprises lowering the window into the opening so that a portion of the optically clear resin is directed between the display module and the side portion.

In an embodiment which may be in accordance with any of the preceding embodiments, the method comprises, upon lowering the window into the opening, directing a larger portion of the optically clear resin between the display module and the upper portion than between the window and the inner edge of the upper portion.

In an embodiment which may be in accordance with any of the preceding embodiments, the viscosity of the optically clear resin is 3500 to 5000 mPa·s.

In an embodiment which may be in accordance with any of the preceding embodiments, the optically clear resin is a dual curing resin curable by exposure to first curing conditions and by exposure to second curing conditions, the second curing conditions being capable of curing portions of the optically clear resin that are disposed below and covered by the frame; and the method comprises a first curing by exposing the optically clear resin to the first curing conditions, and a second curing by exposing the optically clear resin to the second curing conditions, thereby curing portions of the optically clear resin that are disposed below and covered by the frame, thereby not being curable by the first curing conditions.

In an embodiment which may be in accordance with any of the preceding embodiments, the optically clear resin is a dual curing resin curable by exposure to first curing conditions, the first curing conditions comprising irradiating with ultraviolet light, and by exposure to second curing conditions, and the method comprises a first curing by irradiating the optically clear resin with ultraviolet light, and a second curing by exposing the optically clear resin to the second curing conditions, thereby curing portions of the optically clear resin that are disposed below and covered by the frame, thereby not being curable by the irradiating with ultraviolet light.

In an embodiment which may be in accordance with any of the preceding embodiments, the method comprises placing the display module within the frame by sliding the display module within the side portion at the two or more opposing sides of the electronic device prior to disposing the window in the opening.

In an embodiment which may be in accordance with any of the preceding embodiments, the method comprises positioning the display module within the frame so that at least a part of the inactive area is disposed below and covered by the upper portion of the frame so that the upper portion extends over the inactive area at at least one side of the electronic device towards the opposing side of the electronic device to a distance of 0.2 mm from the active area or further, so that at most 0.2 mm of the inactive area at the at least one side of the electronic device is visible through the opening.

In an embodiment which may be in accordance with any of the preceding embodiments, the method comprises positioning the display module within the frame so that the upper portion extends over the inactive area at at least one side of the electronic device towards the opposing side of the electronic device to a distance of 0.2 mm from the active area or further, so that at most 0.2 mm of the inactive area at the at least one side of the electronic device is visible through the opening.

In an embodiment which may be in accordance with any of the preceding embodiments, the active area and the inactive area are divided by a boundary, and the method comprises positioning the display module within the frame so that the boundary is in alignment with the inner edge of the upper portion.

In an embodiment which may be in accordance with any of the preceding embodiments, the method comprises positioning the display module within the frame so that a part of the active area extends behind and is covered by the upper portion at at least one of the opposing sides of the electronic device so that the part of the active area is not visible.

In an embodiment which may be in accordance with any of the preceding embodiments, the window has an upper surface, and the upper portion has an upper edge; and the method comprises disposing the window in the opening so that the upper surface of the window is flush with the upper edge of the upper portion.

According to a third aspect, an electronic device may have two or more opposing sides, the electronic device comprising a frame and a display module, the frame at least partially surrounding the display module; the display module having an active area and an inactive area adjacent to the active area and at the periphery of the display module; the frame comprising a side portion and an upper portion on an upper side of the electronic device, the upper portion extending a determined distance from the side portion towards the active area of the display module and ending at an inner edge of the upper portion; and at least a part of the inactive area at at least one side of the electronic device is disposed below and covered by the upper portion of the frame so that the upper portion extends over the inactive area at at least one side of the electronic device towards the active area to a distance of 0.2 mm from the active area or further, so that the entire active area and at most 0.2 mm of the inactive area at the side of the electronic device are visible, or at least a part of the active area is visible.

In an embodiment, the upper portion extends towards the active area at at least one side of the electronic device towards the opposing side of the electronic device to a distance of 0.2 mm from the active area or further, so that at most 0.2 mm of the inactive area at the at least one side of the electronic device is visible through the opening.

In an embodiment which may be in accordance with the preceding embodiment, the active area and the inactive area are divided by a boundary, and the boundary is in alignment with the inner edge of the upper portion.

In an embodiment which may be in accordance with any of the preceding embodiments, a part of the active area extends behind and is covered by the upper portion so that the part of the active area is not visible.

In an embodiment which may be in accordance with any of the preceding embodiments, the electronic device has two or more opposing sides, and the display module has a width and a length, the frame comprising, at two or more opposing sides of the electronic device, a side portion and an upper portion on an upper side of the electronic device, the upper portion extending a determined distance from the side portion towards the opposing side of the electronic device and ending at an inner edge of the upper portion, and the inner edges of the upper portion defining an opening having a width smaller than the width of the display module; wherein the display module is disposed within the frame so that at least a part of the inactive area is disposed below and covered by the upper portion of the frame, at least a part of the active area being visible through the opening, so that the upper portion extends over the inactive area at at least one side of the electronic device towards the opposing side of the electronic device to a distance of 0.2 mm from the active area or further, so that at most 0.2 mm of the inactive area at the at least one side of the electronic device is visible through the opening.

In an embodiment which may be in accordance with any of the preceding embodiments, the active area of the display module has a width substantially equal to or greater than the width of the opening.

According to a fourth aspect, a method for manufacturing an electronic device having two or more opposing sides may comprise providing a frame and a display module, the display module having an active area and an inactive area adjacent to the active area and at the periphery of the display module, and the frame comprising a side portion and an upper portion on an upper side of the electronic device, the upper portion extending from the side portion and ending at an inner edge of the upper portion; placing the display module within the frame so that the upper portion extends a determined distance towards the active area of the display module, thereby disposing at least a part of the inactive area at a side of the electronic device below and covered by the upper portion of the frame so that the upper portion extends over the inactive area at at least one side of the electronic device towards the active area to a distance of 0.2 mm from the active area or further, so that the entire active area and at most 0.2 mm of the inactive area at the side of the electronic device are visible, or at least a part of the active area is visible.

In an embodiment, the method comprises positioning the display module within the frame so that the upper portion extends towards the active area at at least one side of the electronic device towards the opposing side of the electronic device to a distance of 0.2 mm from the active area or further, so that at most 0.2 mm of the inactive area at the at least one side of the electronic device is visible through the opening.

In an embodiment which may be in accordance with the preceding embodiment, the method comprises positioning the display module within the frame so that the active area and the inactive area are divided by a boundary, and the boundary is in alignment with the inner edge of the upper portion.

In an embodiment which may be in accordance with any of the preceding embodiments, the method comprises positioning the display module within the frame so that a part of the active area extends behind and is covered by the upper portion so that the part of the active area is not visible.

In an embodiment which may be in accordance with any of the preceding embodiments, the display module has a width and a length, and the frame comprises, at two or more opposing sides of the electronic device, a side portion and an upper portion on an upper side of the electronic device, the upper portion extending a determined distance from the side portion towards the opposing side of the electronic device and ending at an inner edge of the upper portion, and the inner edges of the upper portion defining an opening having a width smaller than the width of the display module; wherein the method comprises placing the display module within the frame so that at least a part of the inactive area is disposed below and being covered by the upper portion of the frame, at least a part of the active area being visible through the opening, and positioning the display module within the frame so that at least a part of the inactive area is disposed below and covered by the upper portion of the frame so that the upper portion extends over the inactive area at at least one side of the electronic device towards the opposing side of the electronic device to a distance of 0.2 mm from the active area or further, so that at most 0.2 mm of the inactive area at the at least one side of the electronic device is visible through the opening.

Although some of the present embodiments may be described and illustrated herein as being implemented in a smartphone, a mobile phone, or a tablet computer, these are only examples of a device and not a limitation. As those skilled in the art will appreciate, the present embodiments are suitable for application in a variety of different types of mobile devices, such as game consoles or game controllers, various wearable devices, etc.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought.

The term "comprising" is used in this specification to mean including the features followed thereafter, without excluding the presence of one or more additional features.

The invention claimed is:

1. An electronic device having two or more opposing sides, the electronic device comprising a display module having a width and a length, a window on the display module, and a frame at least partly surrounding the display module,
   the frame comprising, at two or more opposing sides of the electronic device, a side portion and an upper portion on an upper side of the electronic device, the upper portion extending a determined distance from the side portion towards the opposing side of the electronic device and ending at an inner edge of the upper portion, and
   the inner edge of the upper portion defining an opening having a width smaller than the width of the display module; and
   the display module having an active area and an inactive area adjacent to the active area and at the periphery of the display module; wherein
   the display module is disposed within the frame so that at least a part of the inactive area is disposed below and covered by the upper portion of the frame, at least a part of the active area being visible through the opening, and the window is disposed in the opening;
   the window is laminated to the display module using a layer of cured optically clear resin extending between the display module and the window, thereby attaching the window to the display module; and
   the layer of cured optically clear resin extends into a gap between the display module and the upper portion of the frame.

2. The electronic device as defined in claim 1, wherein at least a part of the inactive area is disposed below and covered by the upper portion of the frame so that the upper portion extends over the inactive area at at least one side of the electronic device towards the opposing side of the electronic device to a distance of 0.2 mm from the active area or further, so that at most 0.2 mm of the inactive area at the at least one side of the electronic device is visible through the opening.

3. The electronic device as defined in claim 2, wherein the active area and the inactive area are divided by a boundary, and the boundary is in alignment with the inner edge of the upper portion.

4. The electronic device as defined in claim 1, wherein a portion of the layer of cured optically clear resin extends into a gap between the window and the inner edge of the upper portion of the frame; and
   wherein a larger portion of the layer of cured optically clear resin extends between the display module and the upper portion of the frame than between the window and the inner edge of the upper portion of the frame.

5. The electronic device as defined in claim 1, wherein the layer of cured optically clear resin extends between the display module and the side portion.

6. The electronic device as defined in claim 1, wherein the window has an upper surface, and the upper portion has an upper edge; and the upper surface of the window is flush with the upper edge of the upper portion.

7. The electronic device as defined in claim 1, wherein the window has a width, and the entire width of the window is transparent.

8. An electronic device having two or more opposing sides, the electronic device comprising a frame and a display module, the frame at least partially surrounding the display module;
the display module having an active area and an inactive area adjacent to the active area and at the periphery of the display module;
the frame comprising a side portion and an upper portion on an upper side of the electronic device, the upper portion extending a determined distance from the side portion towards the active area of the display module and ending at an inner edge of the upper portion; and wherein
at least a part of the inactive area at at least one side of the electronic device is disposed below and covered by the upper portion of the frame so that the upper portion extends over the inactive area at at least one side of the electronic device towards the active area to a distance of 0.2 mm from the active area or further, so that
the entire active area and at most 0.2 mm of the inactive area at the side of the electronic device are visible, or at least a part of the active area is visible.

9. The electronic device as defined in claim 8, wherein the active area and the inactive area are divided by a boundary, and the boundary is in alignment with the inner edge of the upper portion.

10. The electronic device as defined in claim 8, wherein the electronic device has two or more opposing sides, and the display module has a width and a length,
the frame comprising, at two or more opposing sides of the electronic device, a side portion and an upper portion on an upper side of the electronic device, the upper portion extending a determined distance from the side portion towards the opposing side of the electronic device and ending at an inner edge of the upper portion, and the inner edge of the upper portion defining an opening having a width smaller than the width of the display module; wherein
the display module is disposed within the frame so that at least a part of the inactive area is disposed below and covered by the upper portion of the frame, at least a part of the active area being visible through the opening, so that the upper portion extends over the inactive area at at least one side of the electronic device towards the opposing side of the electronic device to a distance of 0.2 mm from the active area or further, so that at most 0.2 mm of the inactive area at the at least one side of the electronic device is visible through the opening.

11. The electronic device as defined in claim 10, wherein the active area of the display module has a width substantially equal to or greater than the width of the opening.

12. The electronic device as defined in claim 8, wherein a layer of cured optically clear resin extends into a gap between the display module and the upper portion of the frame.

13. The electronic device as defined in claim 12, further comprising a window on the display module, wherein the window is laminated to the display module using the layer of cured optically clear resin extending between the display module and the window, thereby attaching the window to the display module.

14. The electronic device as defined in claim 12, wherein the layer of cured optically clear resin extends between the display module and the side portion.

15. A mobile device having two or more opposing sides, the mobile device comprising a display module having a width and a length, a window on the display module, and a frame at least partly surrounding the display module,
the frame comprising, at two or more opposing sides of the mobile device, a side portion and an upper portion on an upper side of the mobile device, the upper portion extending a determined distance from the side portion towards the opposing side of the mobile device and ending at an inner edge of the upper portion, and
the inner edge of the upper portion defining an opening having a width smaller than the width of the display module; and
the display module having an active area and an inactive area adjacent to the active area and at the periphery of the display module; wherein
the display module is disposed within the frame so that at least a part of the inactive area is disposed below and covered by the upper portion of the frame, at least a part of the active area being visible through the opening, and the window is disposed in the opening;
the window is laminated to the display module using a layer of cured optically clear resin extending between the display module and the window, thereby attaching the window to the display module; and
the layer of cured optically clear resin extends into a gap between the display module and the upper portion of the frame.

16. The mobile device as defined in claim 15, wherein at least a part of the inactive area is disposed below and covered by the upper portion of the frame so that the upper portion extends over the inactive area at at least one side of the mobile device towards the opposing side of the mobile device to a distance of 0.2 mm from the active area or further, so that at most 0.2 mm of the inactive area at the at least one side of the mobile device is visible through the opening.

17. The mobile device as defined in claim 16, wherein active area and the inactive area are divided by a boundary, and the boundary is in alignment with the inner edge of the upper portion.

18. The mobile device as defined in claim 15, wherein a portion of the layer of cured optically clear resin extends into a gap between the window and the inner edge of the upper portion of the frame; and
wherein a larger portion of the layer of cured optically clear resin extends between the display module and upper portion of the frame than between the window and the inner edge of the upper portion of the frame.

19. The mobile device as defined in claim 15, wherein the layer of cured optically clear resin extends between the display module and the side portion.

20. The mobile device as defined in claim 15, wherein the window has an upper surface, and the upper portion has an upper edge; and the upper surface of the window is flush with the upper edge of the upper portion.

* * * * *